United States Patent
Lee et al.

(10) Patent No.: US 11,758,258 B2
(45) Date of Patent: Sep. 12, 2023

(54) CAMERA SYSTEM OF MOBILE DEVICE INCLUDING GEOMETRY PHASE LENS

(71) Applicant: SAMSUNG ELECTRONICS CO., LTD., Suwon-si (KR)

(72) Inventors: Chang-Kun Lee, Seoul (KR); Hyun Seok Choi, Seoul (KR); Ju Hyun Kim, Anyang-si (KR); Hong-Seok Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/689,938

(22) Filed: Mar. 8, 2022

(65) Prior Publication Data
US 2022/0294950 A1 Sep. 15, 2022

(30) Foreign Application Priority Data
Mar. 9, 2021 (KR) .................. 10-2021-0031031

(51) Int. Cl.
*H04N 5/335* (2011.01)
*H04N 23/57* (2023.01)
(Continued)

(52) U.S. Cl.
CPC ........... *H04N 23/57* (2023.01); *G02B 27/286* (2013.01); *G03B 30/00* (2021.01); *H04M 1/0216* (2013.01);
(Continued)

(58) Field of Classification Search
CPC .................................................. H04M 1/0214
See application file for complete search history.

(56) References Cited

U.S. PATENT DOCUMENTS 4,072,970 A * 2/1978 Winkler ................. G03B 17/04
396/452
6,864,557 B2 * 3/2005 Turner .............. H01L 27/14647
257/443
(Continued)

FOREIGN PATENT DOCUMENTS

KR 1020200038088 4/2020
KR 1020210107408 9/2021

OTHER PUBLICATIONS

Edmund Optics; "An Introduction to Polarization Directed Flat Lenses"; 2016; Edmund Optics, Inc.; pp. 1-16 (Year: 2016).*
(Continued)

*Primary Examiner* — Gary C Vieaux
(74) *Attorney, Agent, or Firm* — CANTOR COLBURN LLP

(57) ABSTRACT

A camera system of a mobile device includes: a sensor module disposed in a first body connected to a rotation member of the mobile device; and a lens module disposed in a second body connected to the rotation member. When the first body and the second body are rotated with respect to the rotation member to overlap each other, optical axes of the sensor module and the lens module correspond to each other and are operated as a common camera system, and the common camera system provides a first photographing mode and a second photographing mode with different viewing angles based on two focuses generated by a first geometry phase lens included in the lens module.

27 Claims, 18 Drawing Sheets

(51) Int. Cl.
*G03B 30/00* (2021.01)
*H04M 1/02* (2006.01)
*G02B 27/28* (2006.01)
*H04N 23/10* (2023.01)
*H04N 23/16* (2023.01)
*H04N 23/45* (2023.01)
*H04N 23/54* (2023.01)
*H04N 23/55* (2023.01)
*H04N 23/69* (2023.01)
*H04N 23/667* (2023.01)
*H10K 59/65* (2023.01)
*H10K 77/10* (2023.01)
*H10K 102/00* (2023.01)

(52) U.S. Cl.
CPC .......... *H04M 1/0264* (2013.01); *H04N 23/10* (2023.01); *H04N 23/16* (2023.01); *H04N 23/45* (2023.01); *H04N 23/54* (2023.01); *H04N 23/55* (2023.01); *H04N 23/667* (2023.01); *H04N 23/69* (2023.01); *H10K 59/65* (2023.02); *H10K 77/111* (2023.02); *H10K 2102/311* (2023.02)

(56) References Cited

U.S. PATENT DOCUMENTS

| | | | | |
|---|---|---|---|---|
| 7,106,357 | B2* | 9/2006 | Fukuda | G06K 7/1092 348/14.02 |
| 8,639,106 | B1 | 1/2014 | Gleason et al. | |
| 8,754,961 | B2* | 6/2014 | Leskela | H04N 5/2258 348/239 |
| 9,013,458 | B2* | 4/2015 | Cho | H04M 1/0268 345/204 |
| 9,357,109 | B2 | 5/2016 | Hyers | |
| 9,374,516 | B2 | 6/2016 | Osborne | |
| 9,467,666 | B1* | 10/2016 | Topliss | H04N 9/097 |
| 9,871,954 | B2* | 1/2018 | Eromäki | H05K 5/03 |
| 10,142,526 | B2 | 11/2018 | Eromaki et al. | |
| 10,412,281 | B2* | 9/2019 | Konttori | G02B 7/00 |
| 10,469,721 | B2 | 11/2019 | Eromaki et al. | |
| 10,948,801 | B1* | 3/2021 | Lu | G02C 7/083 |
| 11,086,363 | B2* | 8/2021 | Su | G06F 3/1446 |
| 11,194,222 | B2* | 12/2021 | Yaroshchuk | G02B 3/10 |
| 2004/0116166 | A1* | 6/2004 | Makishima | H04M 1/0214 348/E5.028 |
| 2004/0183935 | A1* | 9/2004 | Shimano | H04M 1/0264 348/E5.025 |
| 2008/0186397 | A1* | 8/2008 | Kim | H04N 5/23296 348/335 |
| 2010/0045855 | A1* | 2/2010 | Tanida | H04N 5/2253 348/374 |
| 2010/0194860 | A1 | 8/2010 | Mentz et al. | |
| 2013/0293729 | A1* | 11/2013 | Osawa | H04N 5/23258 348/208.12 |
| 2017/0353633 | A1* | 12/2017 | Eromäki | H04M 1/0216 |
| 2017/0353638 | A1* | 12/2017 | Konttori | H04N 23/55 |
| 2018/0217377 | A1* | 8/2018 | Lam | G02B 27/0172 |
| 2018/0275410 | A1* | 9/2018 | Yeoh | G06F 3/013 |
| 2020/0133335 | A1 | 4/2020 | Wu et al. | |
| 2020/0192540 | A1* | 6/2020 | Li | G06F 3/04886 |
| 2020/0209918 | A1* | 7/2020 | Yoon | G06F 1/1681 |
| 2020/0371551 | A1* | 11/2020 | Kim | G06F 1/1681 |
| 2021/0263318 | A1 | 8/2021 | Lee et al. | |
| 2022/0030143 | A1 | 1/2022 | Kwon et al. | |
| 2022/0252863 | A1* | 8/2022 | Jung | G02B 15/06 |

OTHER PUBLICATIONS

Yu et al.; "Pancharatnam-Berry optical lenses"; May 2019; Journal of the Optical Society of America, pp. D107-D111 (Year: 2019).*

* cited by examiner

CAMERA SYSTEM OF MOBILE DEVICE INCLUDING GEOMETRY PHASE LENS

CROSS-REFERENCE TO RELATED APPLICATION

This application claims priority to Korean Patent Application No. 10-2021-0031031, filed on Mar. 9, 2021, and all the benefits accruing therefrom under 35 U.S.C. § 119, the content of which in its entirety is herein incorporated by reference.

BACKGROUND

(a) Field

The disclosure relates to a camera system of a mobile device.

(b) Description of the Related Art

As technology develops, performance of cameras installed in mobile devices such as mobile phones has been substantially improved, and the performance of the cameras has become a major sales point of the mobile phones. Recently, mobile phones in which a camera with different fixed focuses is installed have been released in the market, and large sensors in which a zooming function is realized or with improved image quality are used for a camera system thereof.

SUMMARY

Embodiments of the invention provide a camera system including a sensor module and a lens module individually installed in two bodies folded by an in-folding method.

Embodiments of the invention provide a camera system including a sensor module and a lens module individually installed in two bodies folded by an out-folding method.

Embodiments of the invention provide a camera system including a sensor module and a lens module individually installed in three bodies folded by an in-folding and an out-folding method.

An embodiment of the invention provides a camera system of a mobile device. In such an embodiment, the camera system includes: a sensor module disposed in a first body connected to a rotation member of the mobile device, where the sensor module includes an image sensor; and a lens module disposed in a second body connected to the rotation member, where the lens module includes a first geometry phase ("GP") lens and at least one optical lens, where the sensor module and the lens module are disposed below a surface of a display panel supported by the first body and the second body, the display panel is foldable in an in-folding way, and when the first body and the second body are rotated with respect to the rotation member to overlap each other, the sensor module and the lens module are operated as a common camera system, a first beam input through the lens module passes through at least one opening of the display panel folded in the in-folding way and is processed by the image sensor, and the common camera system provides a first photographing mode and a second photographing mode with different viewing angles based on two focuses generated by the first GP lens.

In an embodiment, the sensor module may further include a second GP lens, the sensor module may be selectively operated as an individual camera system, and when the sensor module is operated as the individual camera system to convert a second beam input from the display panel into image data, the sensor module may provide a third photographing mode and a fourth photographing mode with different viewing angles based on two focuses generated by the second GP lens.

In an embodiment, when the sensor module is operated as the common camera system with the lens module to convert the first beam into image data, the sensor module and the lens module may provide a fifth photographing mode, a sixth photographing mode, a seventh photographing mode, and an eighth photographing mode with different viewing angles based on the two focuses generated by the first GP lens and the two focuses generated by the second GP lens.

In an embodiment, the lens module may further include a polarization selecting device in front of the first GP lens with respect to an incident direction of the first beam, and the polarization selecting device may electrically or mechanically modulate a polarization state of a beam input to the first GP lens.

In an embodiment, the sensor module may further include a polarization selecting device in front of the image sensor with respect to an incident direction of the second beam, and the polarization selecting device may electrically or mechanically modulate a polarization state of a beam input to the image sensor.

In an embodiment, the sensor module may further include a first polarization selecting device in front of the image sensor and a second polarization selecting device in front of the second GP lens with respect to an incident direction of the second beam, the first polarization selecting device may electrically or mechanically modulate a polarization state of a beam input to the image sensor, and the second polarization selecting device may electrically or mechanically modulate a polarization state of a beam input to the second GP lens.

In an embodiment, the image sensor may include a red band processing layer, a green band processing layer, and a blue band processing layer, and the red band processing layer, the green band processing layer, and the blue band processing layer may respectively process a red band beam, a green band beam, and a blue band beam refracted with different refractive indexes by the first GP lens.

In an embodiment, the red band processing layer, the green band processing layer, and the blue band processing layer may be stacked in order of the red band processing layer, the green band processing layer, and the blue band processing layer with respect to the incident direction of the first beam in the image sensor.

In an embodiment, the red band processing layer, the green band processing layer, and the blue band processing layer may be stacked in order of the blue band processing layer, the green band processing layer, and the red band processing layer with respect to the incident direction of the first beam in the image sensor.

In an embodiment, the image sensor may include a red band image sensor, a green band image sensor, and a blue band image sensor, and the red band image sensor, the green band image sensor, and the blue band image sensor may be respectively disposed on a predetermined side in a three-dimensional shape of the image sensor.

In an embodiment, the image sensor may include a red band image sensor, a green band image sensor, and a blue band image sensor, and the red band image sensor, the green band image sensor, and the blue band image sensor may be respectively disposed on a two-dimensional plane of the image sensor.

In an embodiment, the sensor module may realize a zooming function together with the lens module by moving the image sensor within a predetermined range of the sensor module.

In an embodiment, the at least one opening may include a first opening corresponding to the sensor module and a second opening corresponding to the lens module, and when the display panel is folded in the in-folding way, the first beam may pass through the first opening and the second opening and may be transmitted to the sensor module in the lens module, and the first opening and the second opening may have different sizes from each other.

In an embodiment, the first opening may be bigger than the second opening.

In an embodiment, the at least one opening may be disposed inside or below the display panel, and a plurality of fine holes may be defined in a predetermined portion of the display panel to overlap the at least one opening, or a part of the display panel may be transparent.

An embodiment of the invention provides a camera system of a mobile device. In such an embodiment, the camera system includes: a sensor module disposed in a first body connected to a rotation member of the mobile device, where the sensor module includes an image sensor; and a lens module disposed in a second body connected to the rotation member, where the lens module includes a first GP lens, where the sensor module and the lens module may be disposed below a surface of a display panel supported by the first body and the second body, the display panel is foldable in an out-folding way, and when the first body and the second body are rotated with respect to the rotation member to overlap each other, the sensor module and the lens module may be operated as a common camera system, a first beam input through the display panel folded in the out-folding way passes through respective openings in the sensor module and the lens module and is processed by the image sensor, and the common camera system may provide a first photographing mode and a second photographing mode with different viewing angles based on two focuses generated by the first GP lens.

In an embodiment, the sensor module may further include a second GP lens, the sensor module may be selectively operated as an individual camera system, and when the sensor module is operated as the individual camera system to convert a second beam input from a first opening in the sensor module into image data, the sensor module may provide a third photographing mode and a fourth photographing mode with different viewing angles based on two focuses generated by the second GP lens.

In an embodiment, when the sensor module is operated as the common camera system with the lens module to convert the first beam into image data, the sensor module and the lens module may provide a fifth photographing mode, a sixth photographing mode, a seventh photographing mode, and an eighth photographing mode with different viewing angles based on the two focuses generated by the first GP lens and the two focuses generated by the second GP lens.

In an embodiment, the lens module may further include a polarization selecting device in front of the first GP lens with respect to an incident direction of the first beam, and the polarization selecting device may electrically or mechanically modulate a polarization state of a beam input to the first GP lens.

In an embodiment, the sensor module may further include a polarization selecting device in front of the image sensor with respect to an incident direction of the second beam, and the polarization selecting device may electrically or mechanically modulate a polarization state of a beam input to the image sensor.

In an embodiment, the sensor module may further include a first polarization selecting device in front of the image sensor with respect to an incident direction of the second beam and a second polarization selecting device in front of the second GP lens, the first polarization selecting device may electrically or mechanically modulate a polarization state of a beam input to the image sensor, and the second polarization selecting device may electrically or mechanically modulate a polarization state of a beam input to the second GP lens.

In an embodiment, the image sensor may include a red band processing layer, a green band processing layer, and a blue band processing layer, and the red band processing layer, the green band processing layer, and the blue band processing layer may respectively process a red band beam, a green band beam, and a blue band beam refracted with different refractive indexes by the first GP lens.

In an embodiment, the red band processing layer, the green band processing layer, and the blue band processing layer may be stacked in order of the red band processing layer, the green band processing layer, and the blue band processing layer with respect to the incident direction of the first beam in the image sensor.

In an embodiment, the red band processing layer, the green band processing layer, and the blue band processing layer may be stacked in order of the blue band processing layer, the green band processing layer, and the red band processing layer with respect to the incident direction of the first beam in the image sensor.

In an embodiment, the image sensor may include a red band image sensor, a green band image sensor, and a blue band image sensor, and the red band image sensor, the green band image sensor, and the blue band image sensor may be respectively disposed on a predetermined side in a three-dimensional shape of the image sensor.

In an embodiment, the image sensor may include a red band image sensor, a green band image sensor, and a blue band image sensor, and the red band image sensor, the green band image sensor, and the blue band image sensor may be respectively disposed on a two-dimensional plane of the image sensor.

In an embodiment, the sensor module may realize a zooming function together with the lens module by moving the image sensor within a predetermined range of the sensor module.

In an embodiment, when the display panel is folded in the out-folding way, the first beam may pass through the display panel and may then be transmitted to the sensor module from the lens module through a first opening in the lens module and a second opening in the sensor module, and the first opening and the second opening may have a same size as each other.

In an embodiment, a first opening in the lens module may be disposed inside or below the display panel, and a plurality of fine holes may be defined in a predetermined portion of the display panel to overlap the first opening or a part of the display panel may be transparent.

An embodiment of the invention provides a camera system of a mobile device. In such an embodiment, the camera system includes: a sensor module installed in a first body connected to a first rotation member of the mobile device, where the sensor module includes an image sensor; a first lens module disposed in a second body respectively connected to a first rotation member and a second rotation member of the mobile device, where the first lens module includes a first GP lens; and a second lens module disposed in a third body connected to the second rotation member, where the second lens module includes a second GP lens. In such an embodiment, the sensor module, the first lens module, and the second lens module may be disposed below a surface of a display panel supported by the first body, the second body, and the third body, the first body and the second body are foldable with respect to the first rotation member and overlap each other in an in-folding way and the second body and the third body are foldable with respect to the second rotation member and overlap each other in an out-folding way, and when the first body and the second body are rotated with respect to the first rotation member and overlap each other in the in-folding way and the second body and the third body are rotated with respect to the second rotation member and overlap each other in the out-folding way, the sensor module, the first lens module, and the second lens module may be operated as a common camera system, and the common camera system may provide four photographing modes with different viewing angles based on two focuses generated by the first GP lens and two focuses generated by the second GP lens.

An embodiment of the invention provides a camera system of a mobile device. In such an embodiment, the camera system includes: a sensor module disposed in a first body connected to a rotation member of the mobile device; and a lens module disposed in a second body connected to the rotation member, where when the first body and the second body are rotated with respect to the rotation member to overlap each other, optical axes of the sensor module and the lens module may correspond to each other to configure a common camera system, and the common camera system may provide a first photographing mode and a second photographing mode with different viewing angles based on two focuses generated by a first GP lens included in the lens module.

DETAILED DESCRIPTION

Figure 1:
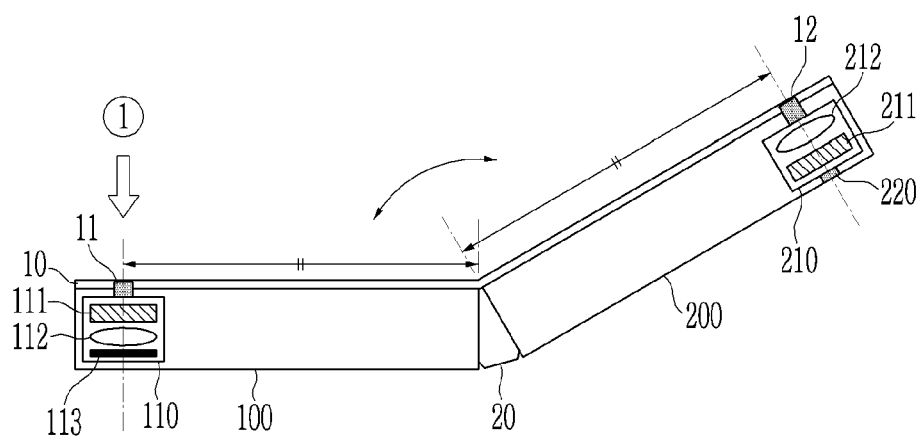
FIG. 1 shows a cross-sectional view of a camera system of a mobile device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 shows a cross-sectional view of a camera system of a mobile device according to an embodiment.

Referring to FIG. 1, an embodiment of the mobile device may include a first body 100, a second body 200, and a rotation member 20. The first body 100 and the second body 200 may be respectively connected to the rotation member 20, and they may be relatively rotated with respect to a rotation axis formed or defined by the rotation member 20. The first body 100 and the second body 200 may configure or form an angle of about 0° to about 360° with each other.

Referring to FIG. 1, the first body 100 and the second body 200 may support the display panel 10. In an embodiment, the mobile device may be an in-folding mobile device that is folded in a way such that the display panel 10 of the mobile device may not be exposed. In such an embodiment, when the first body 100 and the second body 200 overlap each other as the mobile device is folded, the display panel 10 may not be exposed to the outside. In such an embodiment, when the first body 100 and the second body 200 are unfolded with respect to the rotation member 20 (i.e., the first body 100 and the second body 200 configure about 180° with each other), the display panel 10 is unfolded to make a maximum area, and when the first body 100 and the second body 200 overlap each other (i.e., the first body 100 and the second body 200 configure about 0° with each other), the display panel 10 may not be seen.

Referring to FIG. 1, in an embodiment, a sensor module 110 may be installed in the first body 100, and the sensor module 110 may include an image sensor 113. The sensor module 110 may further include a geometry phase ("GP") lens 111 and at least one optical lens 112 so that the sensor module 110 may be operable as an independent optical system. The at least one optical lens 112 may be positioned between the image sensor 113 and the GP lens 111, or the GP lens 111 may be positioned between the at least one optical lens 112 and the image sensor 113. In an embodiment, the sensor module 110 may include a plurality of GP lenses.

In an embodiment, for example, a camera system may be operable in a selfie mode for photographing an object on the front of the display panel 10 and landscapes by using the sensor module 110. Referring to FIG. 1, the sensor module 110 may produce image data from beams (①). That is, when the sensor module 110 is operated as one independent optical system, the sensor module 110 may convert the beam (①) into image data using the GP lens 111, at least one optical lens 112, and the image sensor 113. In an alternative embodiment, the sensor module 110 may convert the beam (①) into image data using a plurality of GP lenses 111 and the image sensor 113.

In an embodiment, an opening 11 for the sensor module 110 may be defined (or under-paneled) inside the display panel 10 or below the display panel 10. In such an embodiment, a fine hole may be formed in a portion of the display panel 10 covering the opening 11 or the portion of the display panel 10 covering the opening 11 may be transparent. In an alternative embodiment, the opening 11 may have a shape (a punch hole) defined through the display panel 10. The beam (①) input through the opening 11 passes through the GP lens 111 and the optical lens 112 and reaches the image sensor 113, and the beam (①) input therethrough may be converted into the image data by the image sensor 113.

The GP lenses 111 and 211 may modulate the beam according to a polarization state of the incident beam and may form a focus of the beam having been transmitted through the GP lens at two or more points. In an embodiment, for example, when the polarization of the incident beam is right-handed circular polarization ("RHCP"), the GP lenses 111 and 211 may modulate a polarization rotating direction into the left (i.e., RHCP to left-handed circular polarization ("LHCP")), and may form a focus to a side to which the beam is transmitted (f>0). In an embodiment, when the polarization of the incident beam is LHCP, the GP lenses 111 and 211 may modulate the polarization rotating direction into the right (i.e., LHCP to RHCP), and may form a focus to a side to which the beam is input (f<0). In an embodiment, when the polarization of the incident beam is straight line polarization, the GP lenses 111 and 211 may not change the polarization state of the beam and may transparently transmit the beam. That is, the sensor module 110 may provide two different photographing modes by using two different focuses formed by the GP lens 111.

In an embodiment where the display panel 10 includes an organic light emitting diode ("OLED") panel, a polarizing plate of the OLED panel may support formation of the focus of the GP lens 111. That is, the polarizing plate of the OLED panel may modulate the beam input to the opening 11 to provide the well-defined polarization beam to the GP lens 111 of the sensor module 110, so the GP lens 111 allows the camera system to be operated in a multi-mode by using the beam polarized by the polarizing plate of the display panel 10.

Referring to FIG. 1, in an embodiment, a lens module 210 may be provided in the second body 200, and the lens module 210 may include a GP lens 211 and at least one optical lens 212. In an embodiment, the lens module 210 may include a plurality of GP lenses 211.

The beam input through the opening 220 formed in the second body 200 may pass through the lens module 210, may pass through the opening 12 formed in the display panel 10, and may be transmitted to the image sensor 113 of the sensor module 110 when the display panel 10 is folded in an in-folding way and the sensor module 110 and the lens module 210 overlap each other. When the mobile device is completely folded, the beam input through the opening 220 of the second body 200 may pass through the lens module 210 and may be transmitted to the sensor module 110 through the opening 12. That is, as the first body 100 and the second body 200 are rotated with respect to the rotation member 20 and overlap each other, the mobile device may be completely folded, and in such a state, an optical axis of the sensor module 110 may match an optical axis of the lens module 210, and the sensor module 110 and the lens module 210 may configure one common camera system.

In an embodiment, positions of the openings 11 and 12 are symmetric with respect to a folding center line of the display panel 10, so the beam input through the opening 220 of the second body 200 when the mobile device is completely folded may pass through the openings 11 and 12 and may reach the image sensor 113 of the sensor module 110, which will now be described in detail with reference to FIG. 2.

Figure 2:
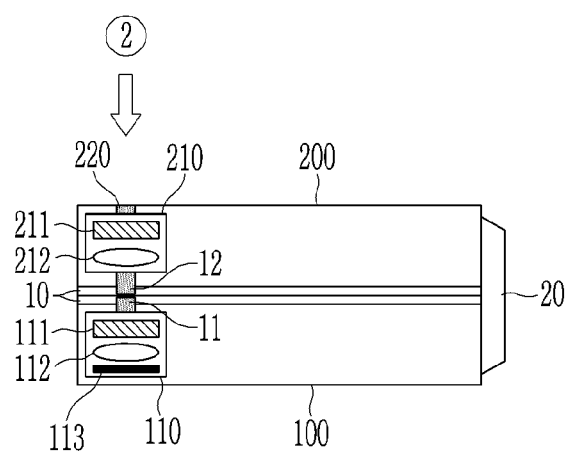
FIG. 2 shows a cross-sectional view of a camera system of a folded mobile device according to an embodiment.

FIG. 2 shows a cross-sectional view of a camera system of a folded mobile device according to an embodiment.

When the mobile device is completely folded, the sensor module 110 and the lens module 210 respectively installed in different bodies or portions of the folded mobile device configure one common optical system, and may be operable as a common camera system. The beam (②) input through the opening 11 may pass through the lens module 210 and may reach the sensor module 110 through the openings 11 and 12, and the beam (②) input therethrough may be converted into image data by the image sensor 113 of the sensor module 110.

The opening 11 positioned on a side of the first body 100 and the opening 12 positioned on a side of the second body 200 may have a same as size or different sizes from each other. In an embodiment, for example, the opening 11 with a relatively big caliber is applicable to the first body 100, and the caliber of the opening 11 may be greater than the caliber of the opening 12 to improve a light receiving amount when the sensor module 110 is operated as a single camera system.

The sensor module 110 and the lens module 210 operable as a single camera system through a connection of the first body 100 and the second body 200 may provide two or four different photographing modes.

In an embodiment, for example, when the sensor module 110 and the lens module 210 respectively include one of the GP lenses 111 and 211, the GP lens may provide two different focuses, so four photographing modes may be realized or defined by a combination of the two GP lenses may be realized.

When the focuses caused by the GP lens 111 of the sensor module are denoted by $f_{11}$ and $f_{12}$, and the focuses caused by the GP lens 211 of the lens module 210 are denoted by $f_{21}$ and $f_{22}$, four photographing modes may be provided by the combination of the respective focuses [i.e., ($f_{21}$), $f_{22}$), ($f_{12}$, $f_{21}$), and ($f_{12}$, $f_{22}$)].

In such an embodiment where the sensor module 110 or the lens module 210 includes the GP lens 111 or 211, the common camera system may provide at least two photographing modes based on at least two focuses that may be formed by the GP lens 111 or 211. In an embodiment, for example, when the sensor module 110 includes the GP lens 111, two photographing modes may be realized by the two different focuses $f_{11}$ and $f_{12}$. In an embodiment where the lens module 210 includes the GP lens 211, two different photographing modes may be realized by the two different focuses $f_{21}$ and $f_{22}$. Here, the two photographing modes by the sensor module 110 may be different from the two photographing modes by the lens module 210.

Figure 3:
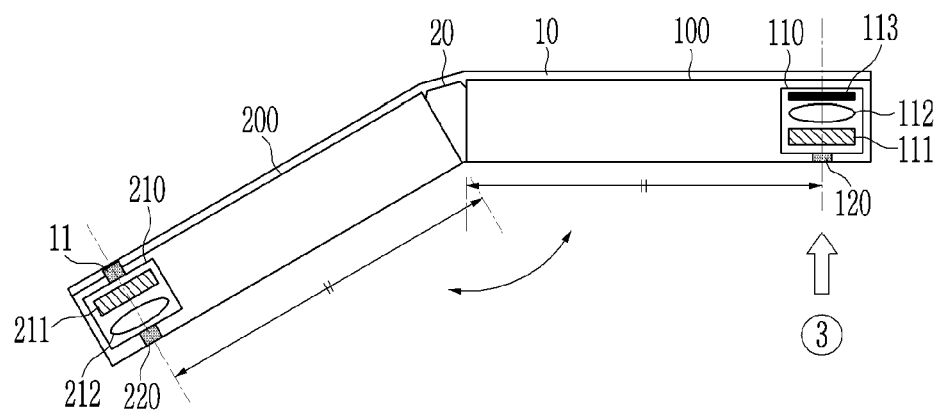
FIG. 3 shows a cross-sectional view of a camera system of a mobile device according to an alternative embodiment.

FIG. 3 shows a cross-sectional view of a camera system of a mobile device according to an alternative embodiment.

Referring to FIG. 3, in an embodiment, the first body 100 and the second body 200 of the mobile device may respectively support the display panel 10, and the mobile device may be an out-folding mobile device folded to expose the display panel 10 to the outside when the first body 100 overlaps the second body 200. When the first body 100 and the second body 200 are unfolded (i.e., when the first body 100 and the second body 200 form the angle of about 180°) with respect to the rotation member 20, the display panel 10 are unfolded to form a maximum area, and when the first body 100 and the second body 200 overlap each other (i.e., when the first body 100 and the second body 200 form the angle of about 0°), the display panel 10 may not be exposed. The sensor module 110 installed in the first body 100 may convert the beam (③) input through the opening 120 of the first body 100 into image data. In this case, the sensor module 110 receives the beam through the opening 120 installed in an opposite side of the display panel 10 on the first body 100, so an additional display or mirror may be installed on the opposite side of the display panel 10 of the first body 100 to photograph a selfie.

The GP lens 111 of the sensor module 110 may produce two focuses, and the sensor module 110 may provide two photographing modes using two focuses produced by the GP lens 111.

In an embodiment, when the mobile device is completely folded, the lens module 210 installed in the second body 200 may transmit the beam input through the opening 11 formed inside the display panel 10 or installed through the display panel 10 through the opening 220 of the second body 200. The opening 11 for the lens module 210 may be formed (under-paneled) in the display panel 10 or may have a shape (a punch hole) defined through the display panel 10. An embodiment of the camera system when a mobile device is folded will now be described with reference to FIG. 4.

Figure 4:
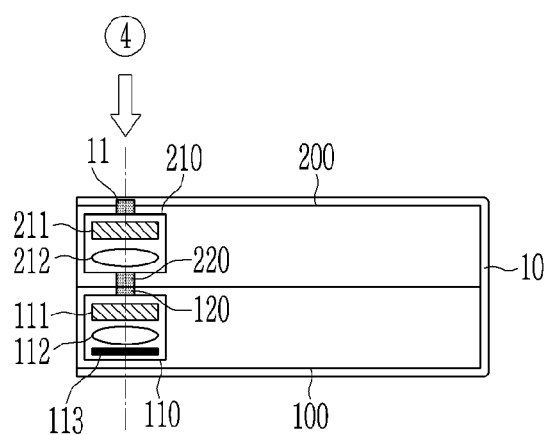
FIG. 4 shows a cross-sectional view of a camera system of a folded mobile device according to an alternative embodiment.

FIG. 4 shows a cross-sectional view of a camera system of a folded mobile device according to an alternative embodiment.

Referring to FIG. 4, in an embodiment, when the sensor module 110 and the lens module 210 of the mobile device is folded in an out-folding way, the beam (④) input through the opening 11 of the display panel 10 may pass through the lens module 210 and may reach the sensor module 110 through the openings 220 and 120 of the respective bodies. The beam (④) may be converted into image data by the image sensor 113 of the sensor module 110.

In such an embodiment, the mobile device in an out-folding way may provide four photographing modes to the maximum through combination of the GP lenses included in the sensor module 110 and/or the lens module 210. In an embodiment, for example, when the sensor module 110 and the lens module 210 respectively include one of the GP lenses 111 and 211, four photographing modes may be provided through the combination of the focuses of the respective GP lenses 111 and 211. In an embodiment where the sensor module 110 or the lens module 210 includes the GP lens, two photographing modes may be respectively provided according to two different focuses that may be generated by the GP lens. In such an embodiment, the two photographing modes provided by the sensor module 110 may be different from the two photographing modes provided by the lens module 210.

Figure 5:
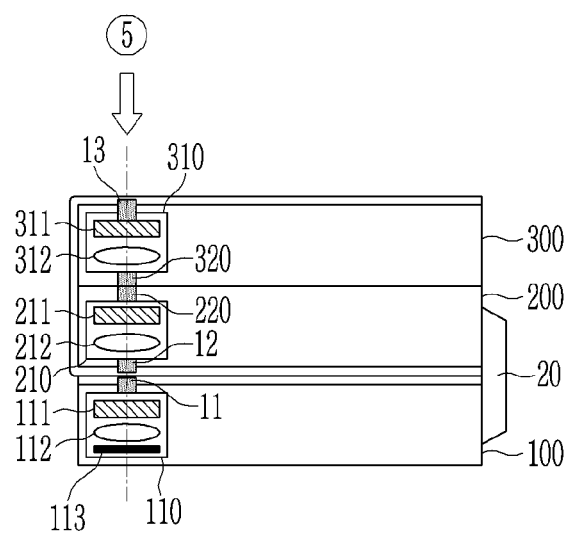
FIG. 5 shows a cross-sectional view of a camera system of a folded mobile device according to another alternative embodiment.

FIG. 5 shows a cross-sectional view of a camera system of a folded mobile device according to another alternative embodiment.

Referring to FIG. 5, an embodiment of the mobile device may be a mobile device in a three-side folding type that may be folded twice. A first body 100 and a second body 200 may be folded according to an in-folding type (displaying is not shown when folded), and the second body 200 and a third body 300 may be folded according to an out-folding type (displaying is exposed when folded). A sensor module 110 including a GP lens 111, at least one optical lens 112 and an image sensor 113 may be installed in the first body. Lens modules 210 and 310 respectively including at least one lens may be installed in the second body 200 and the third body 300. The lens module 210 of the second body 200 may include a GP lens 211 and at least one optical lens 212, and the lens module 310 of the third body 300 may include a GP lens 311 and at least one optical lens 312.

The beam (⑤) initially input through the opening 13 of the display panel 10 may pass through the lens module 310 of the third body 300 and may reach the lens module 210 of the second body 200 through the opening 320 of the third body 300 and the opening 220 of the second body. The beam having passed through the lens module 210 of the second body 200 may reach the sensor module 110 through the opening 12 and the opening 11 of the display panel 10. The beam having reached the sensor module 110 may be converted into image data by the image sensor 113.

When the sensor module 110 and the lens modules 210 and 310 include a single GP lens, the camera system formed by a combination of the sensor module 110 and the lens modules 210 and 310 may provide eight photographing modes as a maximum. In an embodiment, for example, when the focuses caused by the GP lens 111 of the sensor module are denoted by and $f_{12}$, the focuses caused by the GP lens 211 of the lens module 210 of the second body 200 are denoted by $f_{21}$ and $f_{22}$, and the focuses caused by the GP lens 311 of the lens module 310 of the third body 300 are denoted by $f_{31}$ and $f_{32}$, the focus combinations that may be provided by three GP lenses may be [$(f_{11}, f_{21}, f_{31})$, $(f_{11}, f_{22}, f_{31})$, $(f_{12}, f_{21}, f_{31})$, $(f_{12}, f_{22}, f_{31})$, $(f_{11}, f_{21}, f_{32})$, $(f_{11}, f_{22}, f_{32})$, $(f_{12}, f_{21}, f_{32})$, and $(f_{12}, f_{22}, f_{32})$].

In an embodiment where two of the sensor module 110 and the lens modules 210 and 310 respectively include a single GP lens (three cases), the camera system formed by the combination of the sensor module 110 and/or the lens modules 210 and 310 may provide four photographing modes, and the total of twelve photographing modes may be different from each other.

In an embodiment where one of the sensor module 110 and the lens modules 210 and 310 includes a single GP lens (three cases), the camera system formed by the GP lens included in the sensor module 110 or the lens modules 210 and 310 may provide two photographing modes, and the total of six photographing modes may be different from each other.

In an embodiment, the respective bodies of the mobile device in a three-side folding type may be folded in an in-folding way or an out-folding way. In an embodiment where the respective bodies of the mobile device in a three-side folding type are folded in an in-folding way, the beam input to the mobile device may be input through the opening positioned in the body in a like manner of the embodiment described with reference to FIG. 1, and may be transmitted among the respective bodies through the opening in the display panel, and any repetitive detailed description thereof will be omitted. When the respective bodies of the mobile device in a three-side folding type are folded in an out-folding way, the beam input to the mobile device may be input through the opening positioned in the display panel in a like manner of the embodiment described with reference to FIG. 4, and may be transmitted among the respective bodies through the opening in the respective bodies, and any repetitive detailed description thereof will be omitted.

Figure 6:
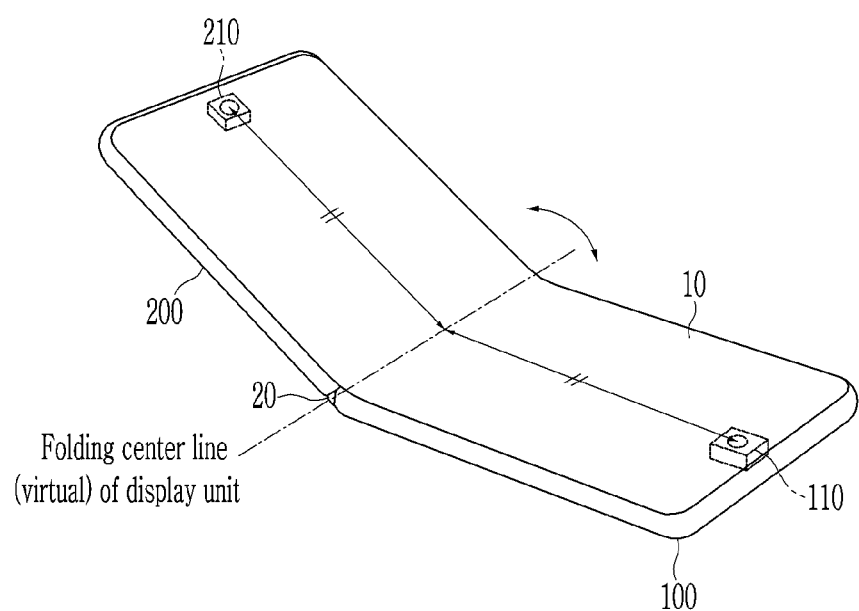
FIG. 6 shows a perspective view of an in-folding mobile device according to an embodiment.

FIG. 6 shows a perspective view of an in-folding mobile device according to an embodiment.

Referring to FIG. 6, in an embodiment of the in-folding mobile device, the sensor module 110 and the lens module 210 may be respectively installed in one of end portions of the first body 100 and the second body 200, and the positions of the sensor module 110 and the lens module 210 may be symmetric with respect to the folding center line (virtual or imaginary line) of the display panel 10. When the mobile device is completely unfolded, the sensor module 110 may be installed in one end of the first body 100, and the lens module 210 may be one end of the second body 200 and may be installed in another end of the mobile device.

Figure 7:
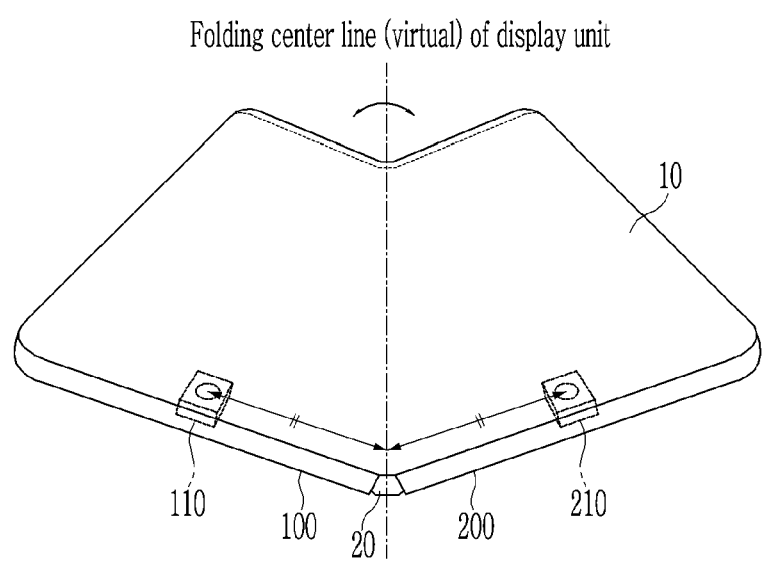
FIG. 7 shows a perspective view of an in-folding mobile device according to an alternative embodiment.

FIG. 7 shows a perspective view of an in-folding mobile device according to an alternative embodiment.

Referring to FIG. 7, in an alternative embodiment of the in-folding mobile device, the sensor module 110 and the lens module 210 may be respectively installed in one of side portions of the first body 100 and the second body 200, and the positions of the sensor module 110 and the lens module 210 may be symmetric with respect to the folding center line of the display panel 10. When the mobile device is completely unfolded, the sensor module 110 may be installed in one side of the first body 100, and the lens module 210 may be installed in the same side of the second body 200. That is, the sensor module 110 and the lens module 210 may be positioned on a same side of the mobile device.

Detailed configurations of the sensor module and the lens module will now be described in detail.

Figure 8:
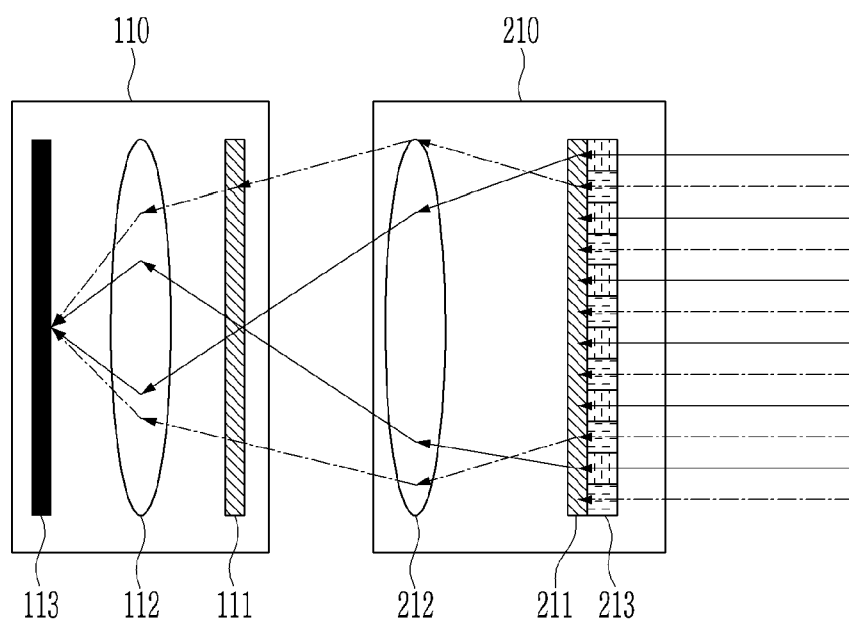
FIG. 8 shows a schematic view of a camera system according to an embodiment.
Figure 9:
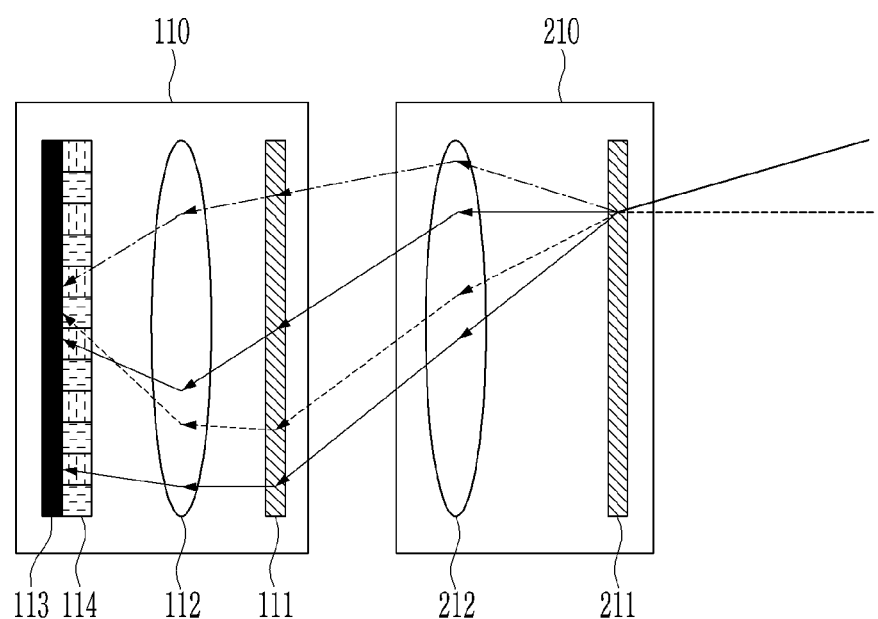
FIG. 9 shows a schematic view of a camera system according to an alternative embodiment.

FIG. 8 shows a schematic view of a camera system according to an embodiment, and FIG. 9 shows a schematic view of a camera system according to an alternative embodiment.

According to an embodiment, the lens module 210 may include a polarization selecting device 213 disposed on the GP lens 111 of the sensor module 110 or the GP lens 211. In such an embodiment, the sensor module 110 may further include a polarization selecting device 114 disposed on the image sensor 113. In an alternative embodiment, as shown in FIG. 9, a polarization selecting device 114 may be disposed on the GP lenses 111 and 211 or the image sensor 113.

The polarization selecting device may be a polarizing plate, a wave retarder array, or a polarization modulate device. The polarization selecting device may be an electrical device or a mechanical device for dynamically switching a polarization angle. In an alternative embodiment, the polarization selecting device may be a passive device for transmitting different polarization components in a spatially different way. The polarization selecting device may modulate the polarization state of the incident beam into the polarization rotating in one direction. In an embodiment, for example, the polarization selecting device may modulate the polarization state of the beam into RHCP or may modulate the polarization state of the beam into LHCP. In an alternative embodiment, the polarization selecting device may modulate the polarization state of the incident beam into the RHCP and the LHCP. Here, the polarization selecting device may be configured with or include a plurality of cells, and the beams input to the respective cells may be modulated into the RHCP or the LHCP. In an embodiment, for example, when the beam input to one of two neighboring cells is modulated into the RHCP, the beam input to a cell neighboring the cell may be modulated into the LHCP.

The polarization selecting device may adjust the polarization angle of the beam input from the outside, such that an embodiment of the camera system may adjust a viewing angle of the photographing mode by controlling the polarization selecting device. The camera system may simultaneously photograph images with different viewing angles by controlling the polarization selecting device.

Referring to FIG. 8, the polarization selecting device 213 may be disposed in front of the GP lens 211 in the lens module 210 with respect to the incident direction of the beam. The beam input to the lens module 210 from the outside of the mobile device may be modulated into different polarization states by the polarization selecting device 213, and may then be refracted by the GP lens 211 according to different focuses. When the polarization states of the beams input to the lens module 210 from the outside of the mobile device become different by the GP lens, the images may be photographed with two different viewing angles. The images photographed with two different viewing angles may be used for image stabilization and image depth measurement.

Referring to FIG. 8, the beam 1 may be refracted to have a real focus by the GP lens 211 after the polarization state is determined by the polarization selecting device 213, and the beam 2 may be refracted to have a virtual focus by the GP lens 211 after the polarization state is determined by the polarization selecting device 213. The beam 1 and the beam 2 transmitted to the sensor module 110 may pass through the GP lens 111 and may be refracted in different directions. Referring to FIG. 8, the beam 1 refracted to have a real focus by the GP lens 211 may be refracted to have a virtual focus by the GP lens 111 of the sensor module 110. The beam 2 refracted to have a virtual focus by the GP lens 211 may be refracted to have a real focus by the GP lens 111 of the sensor module 110.

Referring to FIG. 9, in an alternative embodiment, the polarization selecting device 114 may be disposed in front of the image sensor 113 with respect to the incident direction of the beam in the sensor module 110. In an embodiment where the sensor module 110 includes the GP lens 111, another polarization selecting device may be disposed in front of the GP lens 111 with respect to the incident direction of the beam.

Figure 10:
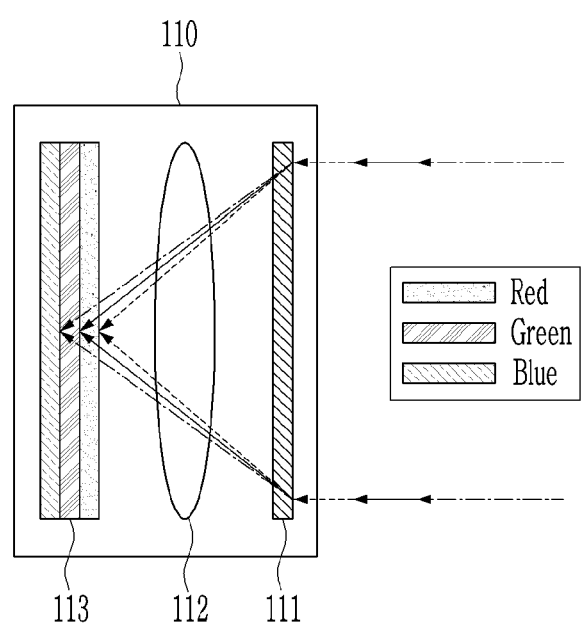
FIG. 10 shows a schematic view of a sensor module according to an embodiment.
Figure 11:
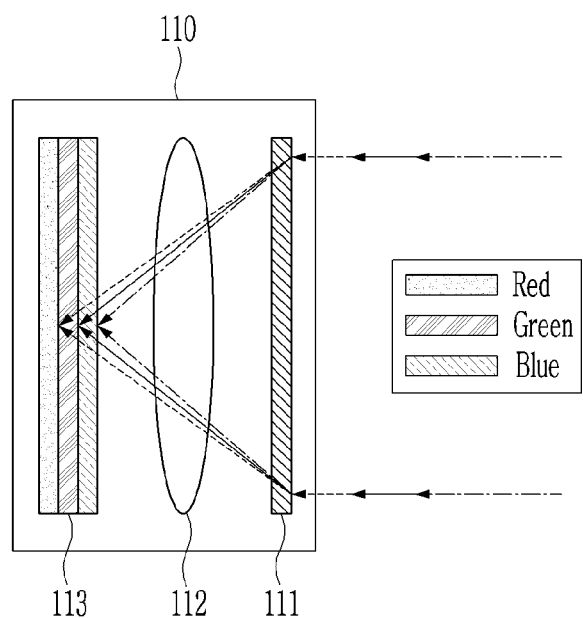
FIG. 11 shows a schematic view of a sensor module according to an alternative embodiment.

FIG. 10 shows a schematic view of a sensor module according to an embodiment, and FIG. 11 shows a schematic view of a sensor module according to an alternative embodiment.

Referring to FIG. 10 and FIG. 11, in an embodiment, the sensor module may be a stackable image sensor 113 for solving a drawback of the under-panel camera by using a chromatic aberration characteristic of the GP lens 111. Because of the chromatic aberration characteristic of the GP lens 111, RGB (red, green, and blue) components may be separated from one beam input to the GP lens 111, and the stackable image sensor 113 may process the RGB components of the beam to generate three sets of image data (i.e., red band image data, green band image data, and blue band image data).

Referring to FIG. 10, the red band beam may have the greatest refractive index, the blue band beam may have the least refractive index, and the green band beam may have a refractive index between the greatest refractive index and the least refractive index. In such an embodiment, to respectively process the beams refracted with different refractive indexes by the GP lens 111, the stackable image sensor 113 may include three processing layers stacked in order of the red band, the green band, and the blue band.

Referring to FIG. 11, in an alternative embodiment, the blue band beam may have the greatest refractive index, the red band beam may have the least refractive index, and the green band beam may have the refractive index between the greatest refractive index and the least refractive index. In such an embodiment, to respectively process the beams refracted with different refractive indexes by the GP lens 111, the stackable image sensor 113 may include three processing layers stacked in order of the blue band, the green band, and the red band.

Embodiments of the stackable image sensor 113 described with reference to FIG. 10 and FIG. 11 may solve the problem of a light receiving amount of the beam input after passing through the display panel 10 by individually processing the RGB components of the beam. In such an embodiment, a camera system with a big caliber may be provided below the panel using a thin GP lens, thereby overcoming the structural limit of the multiple camera system. The image data are selectively chosen according to a wavelength, thereby suppressing an image quality deteriorating phenomenon that may be caused by a diffraction generated by a lattice structure of the panel.

FIG. 10 and FIG. 11 show a method for using chromatic aberration of the GP lens 111 in the sensor module 110, and the chromatic aberration of the GP lens 211 in the lens module 210 may also be used. In an alternative embodiment, chromatic aberration of the GP lens 111 and the GP lens 211 may be used, and chromatic aberration of the GP lens 111 or the GP lens 211 may be used and the other chromatic aberration may be removed by using another method.

The chromatic aberration of the GP lens may be removed by two methods. In an embodiment, the chromatic aberration of a plurality of GP lenses may be removed through a wavelength selective wave plate inserted between a plurality of GP lenses with different focuses. In such an embodiment, the GP lenses with different focuses have different values of chromatic aberration which may be appropriately combined. The wavelength selective wave plate may differently rotate the polarization states for respective wavelengths. An optical lens or a diffraction optical element ("DOE") may be used to remove chromatic aberration of the GP lens. A material of the optical lens may be selected or a diffraction optical element may be designed to have chromatic aberration that is opposite to the chromatic aberration of the GP lens.

Figure 12:
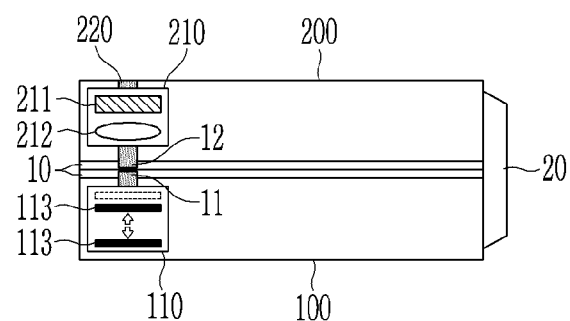
FIG. 12 shows a schematic view of a camera system of a foldable mobile device according to an embodiment.

FIG. 12 shows a schematic view of a camera system of a foldable mobile device according to an embodiment.

Figure 13:
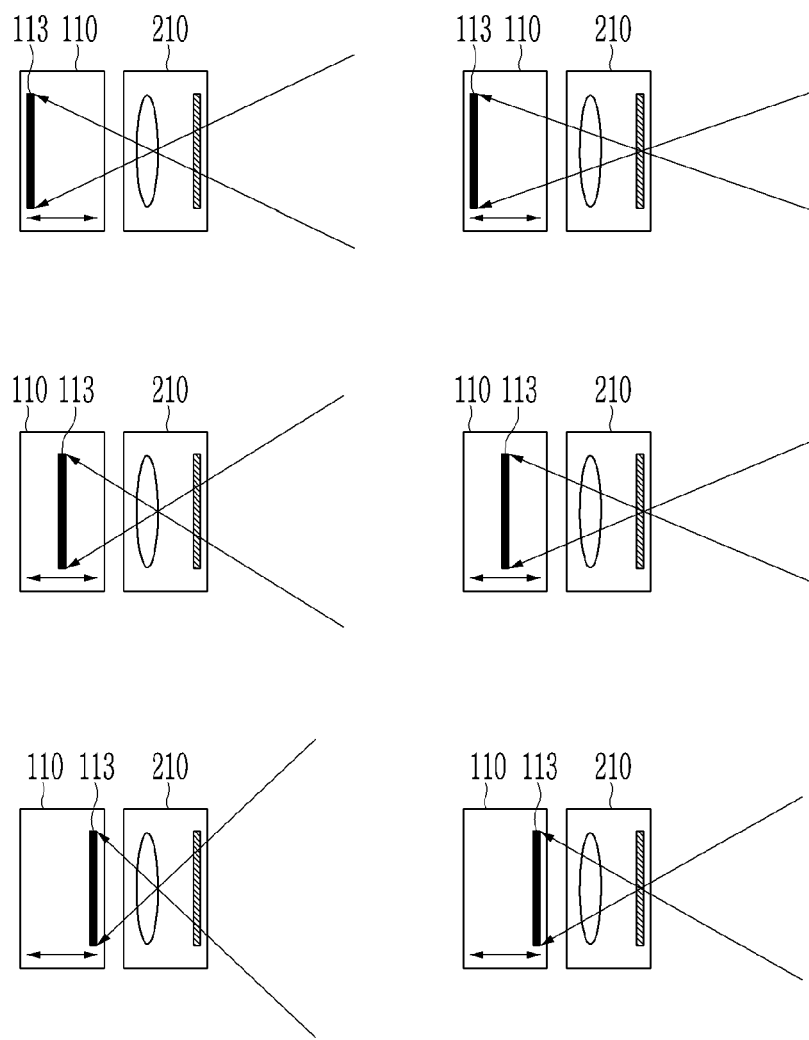
FIG. 13 shows a schematic view of an optical path of a camera system shown in FIG. 12.

FIG. 13 shows a schematic view of an optical path of a camera system shown in FIG. 12.

Referring to FIG. 12, in an embodiment of the camera system of a mobile device, a zooming function may be realized according to a motion of an image sensor 113. In an embodiment, for example, the zooming function of the camera system may be realized in the sensor module 110 by moving the image sensor 113 within a determined range in the sensor module 110. The image sensor 113 may be moved to be distant from or close to the opening 11 (i.e., an incident point of the beam) in the sensor module 110. In an embodiment where the sensor module 110 does not include other lenses 111 and 112, a working distance of the image sensor 113 may be increased to the maximum. In an embodiment where the sensor module 110 does not include the lenses 111 and 112, the lens module 210 may function as the lenses that are not included in the sensor module 110.

In an alternative embodiment, the sensor module 110 may include a plane lens or a GP lens occupying a relatively small space so that the sensor module 110 may be operable as an individual camera system.

In a conventional camera system, the zooming function is realized by moving the position of the lens. In an embodiment of the invention, the camera system may realize the zooming function by remotely controlling the position of the image sensor 113 in the sensor module 110 installed in another body that is not the lens module 210 with respect to the opening 11. The camera system may combine the motion of the image sensor 113 and the multiple focuses of the GP lens, thereby realizing the zooming function with a wider range according to the polarization state of the incident beam.

In an embodiment, the position of at least one lens included in the lens module 210 may be adjusted to be distant from or close to the opening 12 or 220. In such an embodiment, the camera system may realize the zooming function according to a combination of the motion of the image sensor 113 and the motion of at least one lens in the lens module 210. In an alternative embodiment, the camera system may realize the zooming function according to the motion of the image sensor 113 in the sensor module 110, the motion of at least one lens in the lens module 210, and the combination of the plane lens or the GP lens included in the sensor module 110.

In such an embodiment of the camera system, image quality may be substantially improved in a low level illumination condition or in a condition in which the image is not stabilized, by applying an optical image stabilizer ("OIS") with a high specification using a wide space for moving the image sensor 113 provided in the sensor module 110.

In FIG. 13, viewing angles and optical paths of various zooming functions through the motion of the image sensor 113 are shown.

Figure 14A:
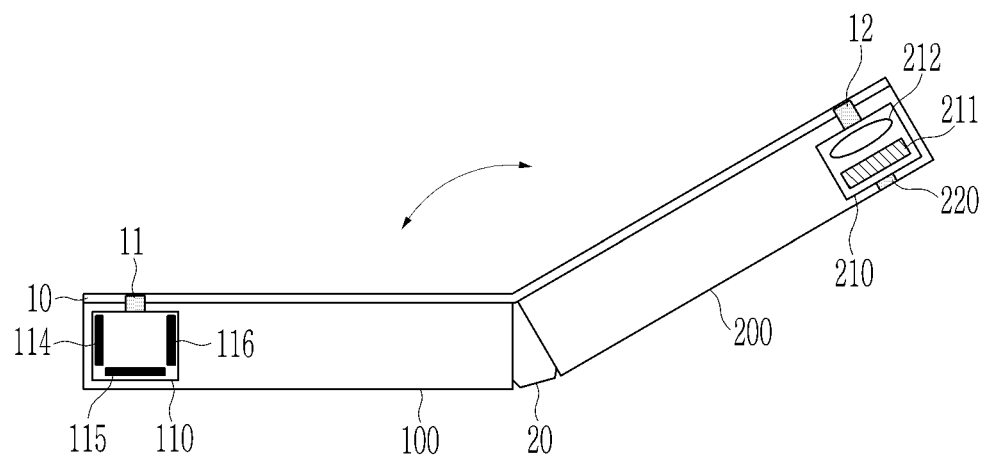
FIG. 14A, FIG. 14B and FIG. 15 show schematic views of a camera system of a mobile device according to an alternative embodiment.
Figure 14B:
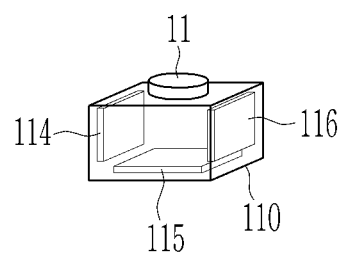
Figure 15:
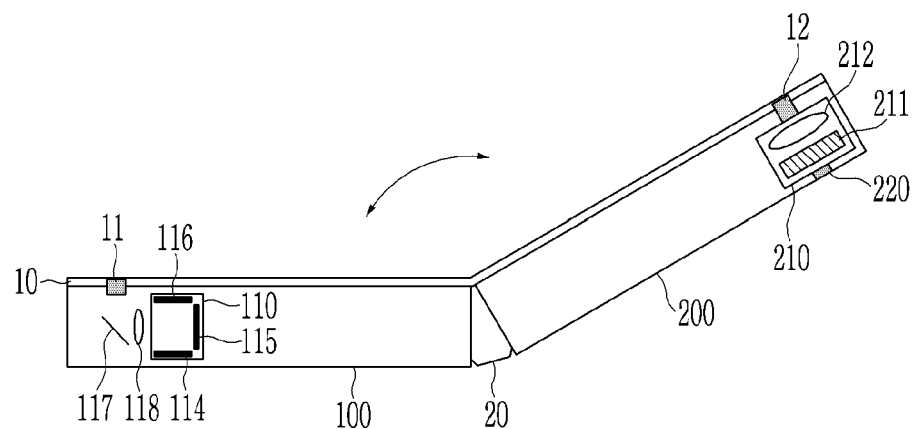

FIG. 14A, FIG. 14B and FIG. 15 show schematic views of a camera system of a mobile device according to an alternative embodiment.

In an embodiment, as shown in FIGS. 14A and 14B, the sensor module 110 of the camera system of the mobile device may include three image sensors 114, 115, and 116, and the three image sensors 114, 115, and 116 may convert the beams with different wavelength bands into image data. The sensor module 110 may further include a light transmitter (not shown) for transmitting the beams that are input through the opening 11 to the respective image sensors 114, 115, and 116.

In an embodiment, the three image sensors may include a red band image sensor 114, a green band image sensor 115, and a blue band image sensor 116. The beams with different wavelength bands are processed by different image sensors, thereby increasing the light receiving amount. The image data are selectively chosen according to the wavelengths, thereby suppressing the image quality deteriorating phenomenon that may be caused by the diffraction generated by the lattice structure of the panel.

Referring to FIGS. 14A and 14B, a red band image sensor 114, a green band image sensor 115, and a blue band image sensor 116 are arranged on respective sides of the sensor module 110 that forms a hexahedron. According to the embodiment, a plurality of image sensors for processing beams with different bandwidths may be arranged in an inner space of the sensor module 110, and when the sensor module 110 overlaps the lens module 210 according to a folding manipulation of the mobile device, an image of a photographed object may be formed on a plurality of image sensors by the lens module 210.

Referring to FIG. 14B, an embodiment of the sensor module 110 may have a hexahedron shape, but the sensor module 110 may have another three-dimensional shape, and a plurality of image sensors may be disposed on a predetermined portion of the three-dimensional shape. In an alternative embodiment, a red band image sensor 114, a green band image sensor 115, and a blue band image sensor 116 may be sequentially arranged on a two-dimensional plane. In such an embodiment where the red band image sensor 114, the green band image sensor 115, and the blue band image sensor 116 are arranged on a plane, an additional optical system including a mirror and/or a lens may be used to control paths of the red band beam, the green band beam, and the blue band beam.

In an embodiment where the sensor module 110 or the lens module 210 includes a GP lens, the red band beam, the green band beam, and the blue band beam may respectively reach the red band image sensor 114, the green band image sensor 115, and the blue band image sensor 116 positioned on different points in the sensor module 110 according to a chromatic aberration characteristic of the GP lens.

The optical system may be variously modified so that the sensor module 110 may be efficiently disposed in the first body 100. Referring to FIG. 15, the optical system may further include a mirror 117 and a lens 118. The beam input through the opening 11 may be reflected and refracted by the mirror 117 and the lens 118 to reach the sensor module 110.

The sensor module 110 may include a plane lens or a GP lens occupying a relatively small space so that the sensor module 110 may be operable as a camera system in embodiments of FIG. 14 and FIG. 15.

According to embodiments of the disclosure, as described above, when the mobile device is folded in an in-folding or out-folding way, the sensor module and the lens module included in the respective bodies are used as one common camera system, thereby solving the problem of the physical space limit of the camera system installed in the mobile device. In an embodiment where the image sensor is disposed in the sensor module, space usability of the camera system may be maximized. In an embodiment, the photographing mode with a plurality of viewing angles in a narrow area by using the GP lens may be realized.

Figure 16:
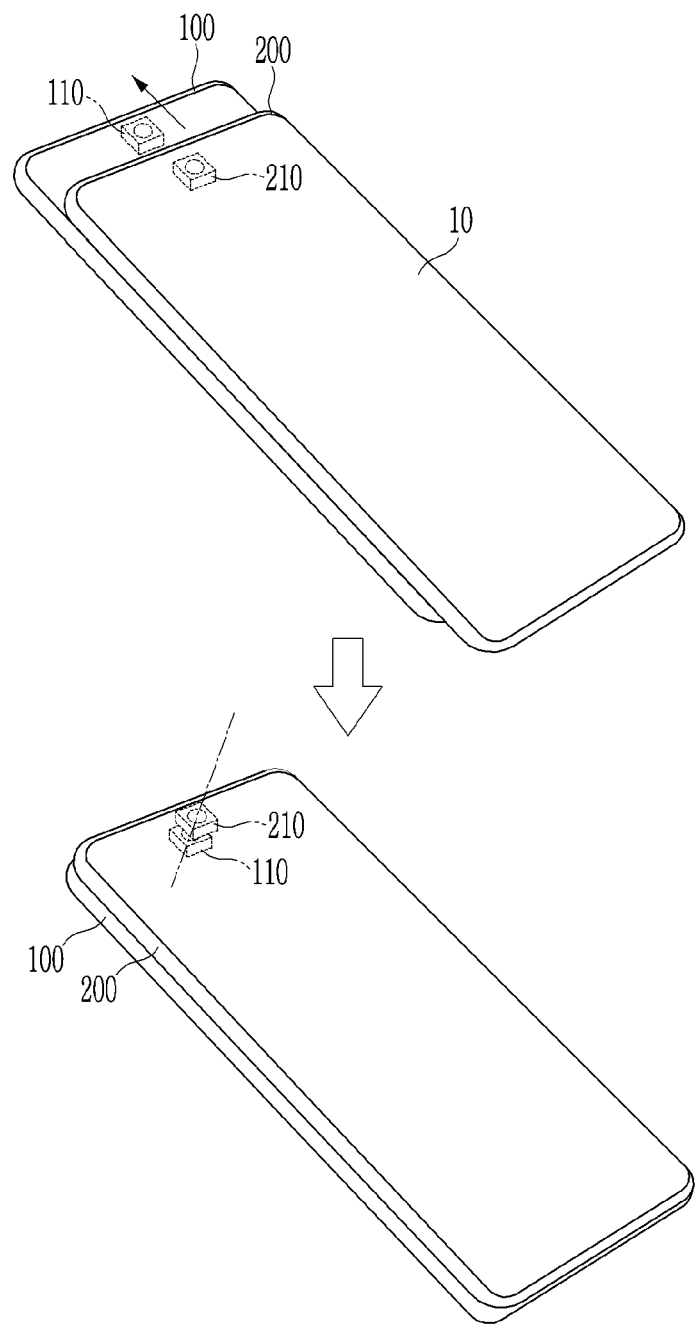
FIG. 16 shows a perspective view of a sliding-type mobile device according to an embodiment.

FIG. 16 shows a perspective view of a sliding-type mobile device according to an embodiment.

In an embodiment, the first body 100 and the second body 200 of the mobile device may overlap each other according to a sliding method. Before the respective bodies of the mobile device overlap each other, the sensor module 110 included in the first body 100 may be operated as an individual optical system, and after the first body 100 and the second body 200 of the mobile device overlap each other, the sensor module 110 included in the first body 100 and the lens module 210 included in the second body 200 may be operated as one common camera system.

Referring to FIG. 16, when the second body 200 slides and the first body 100 overlaps the second body 200, optical axes of the sensor module 110 and the lens module 210 correspond to each other, so the sensor module 110 and the lens module 210 may configure one common camera system.

Figure 17:
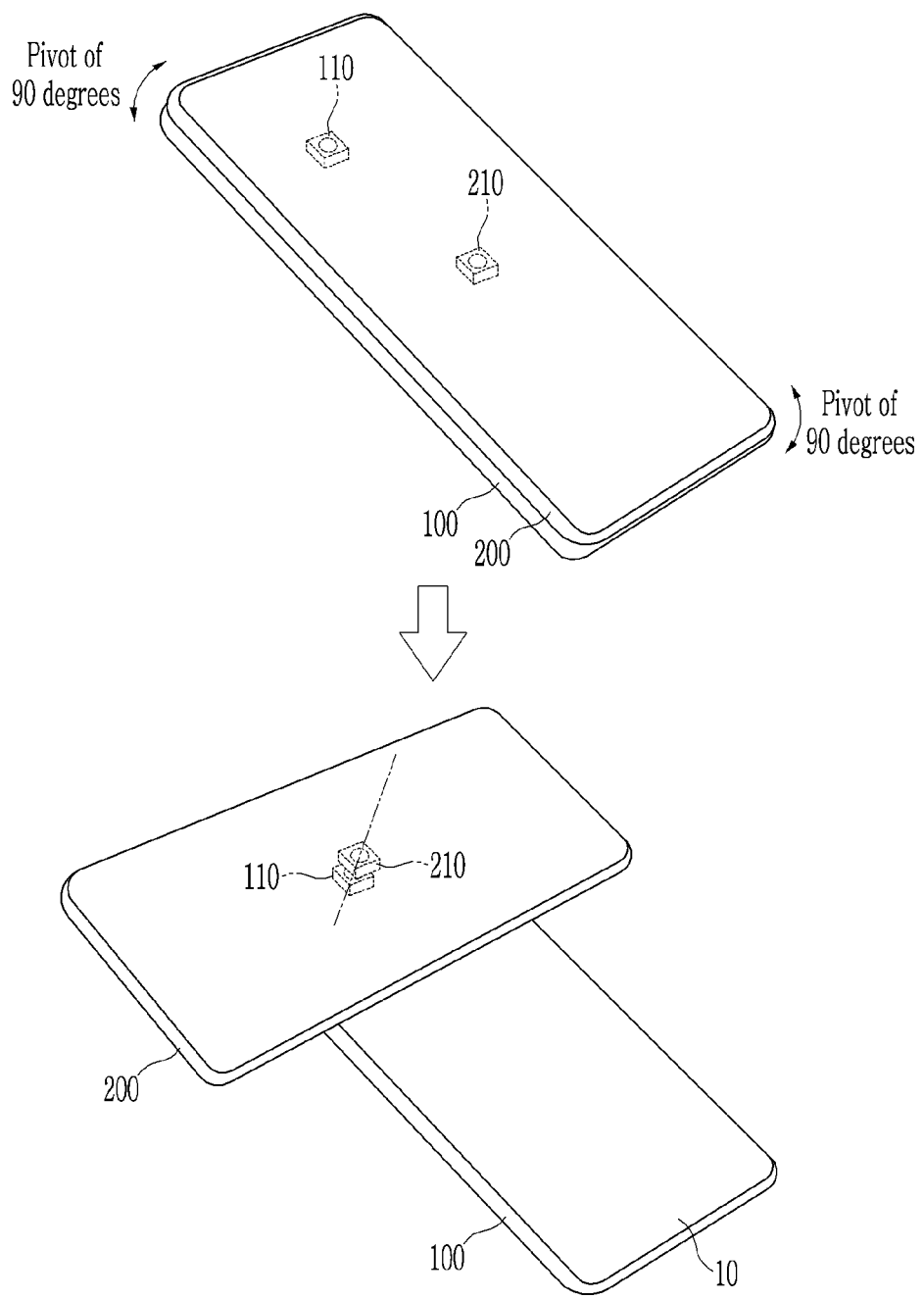
FIG. 17 shows a perspective view of a pivot-type mobile device according to an embodiment.

FIG. 17 shows a perspective view of a pivot-type mobile device according to an embodiment.

In an embodiment, the second body 200 of the mobile device may rotate according to a pivoting method to overlap the first body 100 or configure 90° with respect to the first body 100. Before or after pivoting the second body 200, the sensor module 110 in the first body 100 and the lens module in the second body 200 may configure one common camera system.

Referring to FIG. 17, when the second body 200 is pivoted by the angle of about 90° with respect to the first body 100, the optical axes of the sensor module 110 and the lens module 210 correspond to each other, and the sensor module 110 and the lens module 210 may be operated as one common camera system.

In an embodiment, the optical axes of the sensor module 110 and the lens module 210 may not correspond to each other when the first body 100 overlaps the second body 200, and the beam input to the lens module 210 may be transmitted to the sensor module 110 by the optical connection member for connecting the sensor module 110 and the lens module 210. In an alternative embodiment, when the first body 100 overlaps the second body 200, the optical axes of the sensor module 110 and the lens module 210 may correspond to each other according to the positions of the sensor module 110 and the lens module 210 in the respective bodies.

In embodiments, when the mobile device is folded in an in-folding or out-folding way, the sensor module and the lens module included in the respective bodies are used as one common camera system, thereby solving the physical space limit of the camera system installed in the mobile device. In embodiments where the image sensor is disposed in the sensor module, space usability of the camera system may be maximized. In such embodiments, the photographing mode having a plurality of viewing angles in the narrow area may be provided or realized by using the GP lens.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A camera system of a mobile device, comprising:
a sensor module disposed in a first body connected to a rotation member of the mobile device, wherein the sensor module includes an image sensor; and
a lens module disposed in a second body connected to the rotation member, wherein the lens module includes a first geometry phase lens and at least one optical lens, wherein
the lens module further includes a first polarization selecting device in front of the first geometry phase lens with respect to an incident direction of a beam input to the lens module, wherein the first polarization selecting device electrically or mechanically modulates a polarization state of a beam input to the first geometry phase lens,
the sensor module and the lens module are disposed below a surface of a display panel supported by the first body and the second body, and
the display panel is foldable in an in-folding way,
when the first body and the second body are rotated with respect to the rotation member to overlap each other, the sensor module and the lens module are operated as a common camera system,
a first beam output from the lens module passes through at least one opening of the display panel folded in the in-folding way and is processed by the image sensor, and
the common camera system operates in a first photographing mode and a second photographing mode with different viewing angles based on two focuses generated by modulating the polarization state of the bean input to the first geometry phase lens.

2. The camera system of claim 1, wherein
the sensor module further includes a second geometry phase lens,
the sensor module is selectively operated as an individual camera system, and
when the sensor module is operated as the individual camera system to convert a second beam input thereto into image data, the sensor module operates in a third photographing mode and a fourth photographing mode with different viewing angles based on two focuses generated by modulating a polarization state of a beam input to the second geometry phase lens.

3. The camera system of claim 2, wherein
when the sensor module is operated as the common camera system with the lens module to convert the first beam into image data,
the sensor module and the lens module collectively operate in a fifth photographing mode, a sixth photographing mode, a seventh photographing mode, and an eighth photographing mode with different viewing angles based on the two focuses generated by modulating the polarization state of the beam input to the first geometry phase lens and based on the two focuses generated by modulating a polarization state of a beam input to the second geometry phase lens.

4. The camera system of claim 2, wherein
the sensor module further includes a second polarization selecting device in front of the image sensor with respect to an incident direction of the second beam, and
the second polarization selecting device electrically or mechanically modulates a polarization state of a beam input to the image sensor.

5. The camera system of claim 2, wherein
the sensor module further includes a second polarization selecting device in front of the second geometry phase lens with respect to an incident direction of the second beam, and
the second polarization selecting device electrically or mechanically modulates the polarization state of the beam input to the second geometry phase lens.

6. The camera system of claim 1, wherein
the image sensor includes a red band processing layer, a green band processing layer, and a blue band processing layer, and the red band processing layer, the green band processing layer, and the blue band processing layer respectively process a red band beam, a green band beam, and a blue band beam refracted with different refractive indexes by the first geometry phase lens.

7. The camera system of claim 6, wherein
the red band processing layer, the green band processing layer, and the blue band processing layer are stacked in order of the red band processing layer, the green band processing layer, and the blue band processing layer with respect to the incident direction of the first beam in the image sensor.

8. The camera system of claim 1, wherein
the red band processing layer, the green band processing layer, and the blue band processing layer are stacked in order of the blue band processing layer, the green band processing layer, and the red band processing layer with respect to the incident direction of the first beam in the image sensor.

9. The camera system of claim 1, wherein
the image sensor includes a red band image sensor, a green band image sensor, and a blue band image sensor, and
the red band image sensor, the green band image sensor, and the blue band image sensor are respectively disposed on a predetermined side in a three-dimensional shape of the image sensor.

10. The camera system of claim 1, wherein
the image sensor moves within a predetermined ranges in the sensor module such that the sensor module realizes a zooming function together with the lens module by moving the image sensor and by modulating the polarization state of the beam to be input to the first geometry phase lens.

11. The camera system of claim 1, wherein
the at least one opening includes a first opening corresponding to the sensor module and a second opening corresponding to the lens module, and
when the display panel is folded in the in-folding way, the first beam passes through the first opening and the second opening and is transmitted to the sensor module in the lens module, and
the first opening and the second opening have different sizes from each other.

12. The camera system of claim 11, wherein
the first opening is bigger than the second opening.

13. The camera system of claim 1, wherein
the at least one opening is disposed inside or below the display panel, and
a plurality of fine holes is defined in a predetermined portion of the display panel to overlap the at least one opening, or a part of the display panel is transparent.

14. A camera system of a mobile device comprising:
a sensor module disposed in a first body connected to a rotation member of the mobile device, wherein the sensor module includes an image sensor; and
a lens module disposed in a second body connected to the rotation member, wherein the lens module includes a first geometry phase lens,
wherein
the lens module further includes a first polarization selecting device in front of the first geometry phase lens with respect to an incident direction of a beam input to the lens module, wherein the first polarization selecting device electrically or mechanically modulates a polarization state of a beam input to the first geometry phase lens,
the sensor module and the lens module are disposed below a surface of a display panel supported by the first body and the second body,
the display panel is foldable in an out-folding way,
when the first body and the second body are rotated with respect to the rotation member to overlap each other, the sensor module and the lens module are operated as a common camera system,
a first beam input through the display panel folded in the out-folding way passes through respective openings in the sensor module and the lens module and is processed by the image sensor, and
the common camera system operates in a first photographing mode and a second photographing mode with different viewing angles based on two focuses generated by modulating the polarization state of the beam input to the first geometry phase lens.

15. The camera system of claim 14, wherein
the sensor module further includes a second geometry phase lens,
the sensor module is selectively operated as an individual camera system, and
when the sensor module is operated as an individual camera system to convert a second beam input thereto through a first opening in the sensor module into image data, the sensor module operates in a third photographing mode and a fourth photographing mode with different viewing angles based on two focuses generated by modulating a polarization state of a beam input to the second geometry phase lens.

16. The camera system of claim 15, wherein
when the sensor module is operated as the common camera system with the lens module to convert the first beam into image data, the sensor module and the lens module provide a fifth photographing mode, a sixth photographing mode, a seventh photographing mode, and an eighth photographing mode with different viewing angles based on the two focuses generated by the first geometry phase lens and the two focuses generated by modulating the polarization state of the beam input to second geometry phase lens.

17. The camera system of claim 15, wherein
the sensor module further includes a second polarization selecting device in front of the image sensor with respect to an incident direction of the second beam, and
the second polarization selecting device electrically or mechanically modulates a polarization state of a beam input to the image sensor.

18. The camera system of claim 15, wherein
the sensor module further includes a second polarization selecting device in front of the second geometry phase lens with respect to an incident direction of the second beam, and
the second polarization selecting device electrically or mechanically modulates the polarization state of the beam input to the second geometry phase lens.

19. The camera system of claim 14, wherein
the image sensor includes a red band processing layer, a green band processing layer, and a blue band processing layer, and
the red band processing layer, the green band processing layer, and the blue band processing layer respectively process a red band beam, a green band beam, and a blue band beam refracted with different refractive indexes by the first geometry phase lens.

20. The camera system of claim 19, wherein
the red band processing layer, the green band processing layer, and the blue band processing layer are stacked in order of the red band processing layer, the green band processing layer, and the blue band processing layer with respect to the incident direction of the first beam in the image sensor.

21. The camera system of claim 19, wherein
the red band processing layer, the green band processing layer, and the blue band processing layer are stacked in order of the blue band processing layer, the green band processing layer, and the red band processing layer with respect to the incident direction of the first beam in the image sensor.

22. The camera system of claim 14, wherein
the image sensor includes a red band image sensor, a green band image sensor, and a blue band image sensor, and
the red band image sensor, the green band image sensor, and the blue band image sensor are respectively disposed on a predetermined side in a three-dimensional shape of the image sensor.

23. The camera system of claim 14, wherein
the image sensor moves within a predetermined ranges in the sensor module such that the sensor module realizes a zooming function together with the lens module by moving the image sensor and by modulating the polarization state of the beam input to the first geometry phase lens.

24. The camera system of claim 14, wherein
when the display panel is folded in the out-folding way, the first beam passes through the display panel and is then transmitted to the sensor module from the lens module through a first opening in the lens module and a second opening in the sensor module, and
the first opening and the second opening have a same size as each other.

25. The camera system of claim 14, wherein
a first opening in the lens module is disposed inside or below the display panel, and
a plurality of fine holes is defined in a predetermined portion of the display panel to overlap the first opening, or a part of the display panel is transparent.

26. A camera system of a mobile device comprising:
a sensor module disposed in a first body connected to a first rotation member of the mobile device, wherein the sensor module includes an image sensor;
a first lens module disposed in a second body respectively connected to the first rotation member and a second rotation member of the mobile device, wherein the first lens module includes a first geometry phase lens; and
a second lens module disposed in a third body connected to the second rotation member, wherein the second lens module includes a second geometry phase lens,
wherein
the first lens module further includes a first polarization selecting device in front of the first geometry phase lens with respect to an incident direction of a beam input to the first lens module, wherein the first polarization selecting device electrically or mechanically modulates a polarization state of a beam input to the first geometry phase lens,
the second lens module further includes a second polarization selecting device in front of the first geometry phase lens with respect to an incident direction of a beam input to the second lens module, wherein the second polarization selecting device electrically or mechanically modulates a polarization state of a beam input to the second geometry phase lens,
the sensor module, the first lens module, and the second lens module are disposed below a surface of a display panel supported by the first body, the second body, and the third body, and
the first body and the second body are foldable with respect to the first rotation member and overlap each other in an in-folding way and the second body and the third body are foldable with respect to the second rotation member and overlap each other in an out-folding way,
when the first body and the second body are rotated with respect to the first rotation member to overlap each other in the in-folding way and the second body and the third body are rotated with respect to the second rotation member to overlap each other in the out-folding way, the sensor module, the first lens module, and the second lens module are operated as a common camera system, and the common camera system operates in four photographing modes with different viewing angles based on two focuses generated by modulating the polarization state of the beam input to the first geometry phase lens and two focuses generated by modulating the polarization state of the bam input to the second geometry phase lens.

27. A camera system of a mobile device comprising:
a sensor module disposed in a first body connected to a rotation member of the mobile device; and
a lens module disposed in a second body connected to the rotation member,
wherein
the sensor module and the lens module includes a first geometry phase lens and a polarization selecting device which electrically or mechanically modulates a polarization state of a beam input to the first geometry phase lens,
when the first body and the second body are rotated with respect to the rotation member to overlap each other, optical axes of the sensor module and the lens module correspond to each other and are operated as a common camera system, and
the common camera system operates in a first photographing mode and a second photographing mode with different viewing angles based on two focuses generated by modulating a polarization state of a beam input to the first geometry phase lens.

* * * * *